(12) United States Patent
Seok (10) Patent No.: US 11,600,693 B2
(45) Date of Patent: Mar. 7, 2023

(54) POWER SEMICONDUCTOR DEVICE HAVING GUARD RING STRUCTURE, AND METHOD OF FORMATION

(71) Applicant: Littelfuse, Inc., Chicago, IL (US)

(72) Inventor: Kyoung Wook Seok, Milpitas, CA (US)

(73) Assignee: Littelfuse, Inc., Chicago, IL (US)

( * ) Notice: Subject to any disclaimer, the term of this patent is extended or adjusted under 35 U.S.C. 154(b) by 102 days.

(21) Appl. No.: 17/173,697

(22) Filed: Feb. 11, 2021

(65) Prior Publication Data

US 2021/0167168 A1 Jun. 3, 2021

Related U.S. Application Data

(62) Division of application No. 16/294,332, filed on Mar. 6, 2019, now Pat. No. 10,985,242.

(51) Int. Cl.
| | |
|---|---|
| *H01L 29/06* | (2006.01) |
| *H01L 29/78* | (2006.01) |
| *H01L 29/16* | (2006.01) |
| *H01L 29/66* | (2006.01) |
| *H01L 21/033* | (2006.01) |
| *H01L 29/739* | (2006.01) |

(52) U.S. Cl.
CPC ...... *H01L 29/0634* (2013.01); *H01L 21/0337* (2013.01); *H01L 29/16* (2013.01); *H01L 29/66333* (2013.01); *H01L 29/66712* (2013.01); *H01L 29/7395* (2013.01); *H01L 29/7811* (2013.01)

(58) Field of Classification Search
CPC ............ H01L 21/0337; H01L 21/2253; H01L 21/266; H01L 1/32155; H01L 21/26586; H01L 29/696; H01L 29/404; H01L 29/7802; H01L 29/0634; H01L 29/16; H01L 29/66333; H01L 29/66712; H01L 29/7395; H01L 29/7811; H01L 29/0619
See application file for complete search history.

(56) References Cited

U.S. PATENT DOCUMENTS

| | | | |
|---|---|---|---|
| 9,082,845 B1 | 7/2015 | Seok | |
| 2006/0220156 A1* | 10/2006 | Saito | ................... H01L 29/7811 257/E29.066 |
| 2008/0169526 A1* | 7/2008 | Wakimoto | .......... H01L 29/7811 257/490 |
| 2011/0233666 A1 | 9/2011 | Lui et al. | |
| 2012/0256192 A1* | 10/2012 | Zhang | ................. H01L 29/0661 257/481 |
| 2013/0341751 A1 | 12/2013 | Ono et al. | |

(Continued)

*Primary Examiner* — Galina G Yushina
(74) *Attorney, Agent, or Firm* — KDB Firm PLLC (57) ABSTRACT

In one embodiment, a power semiconductor device may include a semiconductor substrate, wherein the semiconductor substrate comprises an active device region and a junction termination region. The power semiconductor device may also include a polysilicon layer, disposed over the semiconductor substrate. The polysilicon layer may include an active device portion, disposed over the active device region, and defining at least one semiconductor device; and a junction termination portion, disposed over the junction termination region, the junction termination portion defining a ring structure.

9 Claims, 9 Drawing Sheets (56) References Cited

U.S. PATENT DOCUMENTS

| | | | |
|---|---|---|---|
| 2014/0138767 A1* | 5/2014 | Lui ..................... | H01L 21/3081 |
| | | | 438/270 |
| 2015/0162284 A1* | 6/2015 | Ishii ....................... | H01L 24/05 |
| | | | 257/620 |
| 2016/0013265 A1* | 1/2016 | Yilmaz ............... | H01L 29/0623 |
| | | | 257/192 |
| 2016/0020279 A1* | 1/2016 | Turner .............. | H01L 29/66734 |
| | | | 438/135 |
| 2017/0338301 A1* | 11/2017 | Hu ...................... | H01L 29/0634 |
| 2017/0373142 A1 | 12/2017 | Shen et al. | |
| 2018/0286963 A1* | 10/2018 | Bartolf ................ | H01L 29/7395 |

* cited by examiner

FORMING PATTERNED POLYSILICON LAYER ON SEMICONDUCTOR SUBSTRATE, COMPRISING ACTIVE DEVICE PORTION AND JUNCTION TERMINATION PORTION
802

IMPLANTING SUBSTRATE WITH PATTERNED POLYSILICON LAYER IN PLACE, WHEREIN ACTIVE DEVICE REGION FORMED IN SEMICONDUCTOR SUBSTRATE, SUBJACENT THE ACTIVE DEVICE PORTION, AND WHEREIN JUNCTION TERMINATION REGION FORMED IN SEMICONDUCTOR SUBSTRATE, SUBJACENT JUNCTION TERMINATION PORTION
804

POWER SEMICONDUCTOR DEVICE HAVING GUARD RING STRUCTURE, AND METHOD OF FORMATION

CROSS REFERENCE TO RELATED APPLICATION

This application is a divisional of, and claims the benefit of priority to, U.S. patent application Ser. No. 16/294,332, filed Mar. 6, 2019, entitled "FLOATING RING TERMINATION WITH REVERSE FIELD PLATE AND METHOD OF FORMATION," which application is incorporated herein by reference in its entirety.

BACKGROUND

Field

Embodiments relate to the field of power semiconductor devices, including MOSFETs and IGBTs.

Discussion of Related Art

Devices such as a power semiconductor device include insulated gate bipolar transistor (IGBT) devices and field effect transistor (MOSFET) devices. These devices may benefit from junction termination structures that terminate a planar P/N junction on an edge to prevent or reduce leakage. Without proper junction termination, a P/N junction may experience leakage current originating from defects located at the edge of a semiconductor chip containing the power device. Simple junction termination is associated with a low breakdown voltage by high electric field at junction edge, and is more severe at corner edges. One known structure that is used to reduce this problem is a so-called floating ring termination, using guard rings fabricated within a semiconductor substrate.

In known processing technology to generate power semiconductor devices having ring termination structures, a series of seven masks are used, including a ring mask to define the ring termination structures, a poly mask to define gate regions of the power semiconductor device, a P+ implant mask, an N+ implant mask, a contact mask to provide contacts to the power semiconductor device, a metal mask, and a pad mask. Such processing approaches may generate devices having acceptable performance, at the expense of requiring a large number of mask levels.

In view of the above, the present embodiments are provided.

BRIEF SUMMARY

According to embodiments of the disclosure a novel power semiconductor device is provided. The power semiconductor device may include a semiconductor substrate, wherein the semiconductor substrate comprises an active device region and a junction termination region. The power semiconductor device may also include a polysilicon layer, disposed over the semiconductor substrate. The polysilicon layer may include an active device portion, disposed over the active device region, and defining at least one semiconductor device; and a junction termination portion, disposed over the junction termination region, the junction termination portion defining a ring structure.

In another embodiment, a method of forming a semiconductor device may include forming a polysilicon mask over a polysilicon layer, disposed on a semiconductor substrate, wherein the polysilicon mask comprises an active device portion, and a junction termination portion. The method may include implanting a P− dopant to form well regions in the semiconductor substrate, including an active device region, disposed subjacent the active device portion, and a junction termination region, disposed subjacent the junction termination portion. The method may also include forming a P+ mask over the polysilicon mask, forming an N+ implantation mask over the polysilicon mask, forming a contact mask over the polysilicon mask, forming a metal mask over the polysilicon mask, and forming a pad mask over the polysilicon mask.

In another embodiment, a method of forming a semiconductor device is provided. The method may include forming a polysilicon mask on a semiconductor substrate, wherein the polysilicon mask comprises an active device portion, and a junction termination portion, disposed over a junction termination region. The method may include forming a P+ mask over the polysilicon mask, forming an N+ mask over the polysilicon mask, forming a contact mask over the polysilicon mask, forming a metal mask over the polysilicon mask, and forming a pad mask over the polysilicon mask.

BRIEF DESCRIPTION OF THE DRAWINGS

FIG. 3A-3K shows various operations involved in fabricating a power semiconductor device, in accordance with embodiments of the present disclosure;

DESCRIPTION OF EMBODIMENTS

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on,"

and "over", may mean that two or more elements are not in direct contact with one another. For example, "over" may mean that one element is above another element while not contacting one another and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect.

Figure 1:
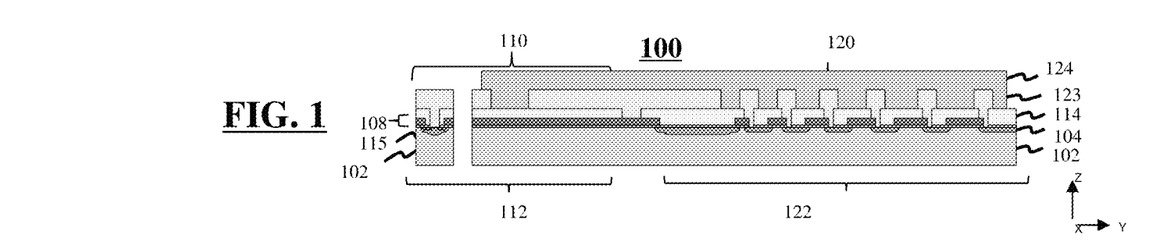
FIG. 1 shows a power semiconductor device according to various embodiments of the disclosure.

Turning to FIG. 1 there is shown a power semiconductor device 100, according to embodiments of the disclosure. In particular, FIG. 1 depicts a top portion of a power semiconductor device. In embodiments where power semiconductor device 100 represents a MOSFET, beneath the figure, an N+ substrate and drain metal are present.

The power semiconductor device 100 may include a semiconductor substrate 102, such as monocrystalline silicon, wherein the semiconductor substrate comprises an active device region 112, including body region 115, and a junction termination region 122. According to various embodiments, the power semiconductor device 100 may include at least one insulated gate bipolar transistor (IGBT) device, or at least one metal oxide semiconductor field effect transistor (MOSFET) device. The power semiconductor device 100 may include other components not shown, such as backside contacts, as known in the art. As shown in FIG. 1, the power semiconductor device 100 includes a polysilicon layer 108, where the polysilicon layer 108 is arranged over different portions of the semiconductor substrate 102. As such, the polysilicon layer 108 may include an active device portion 110, disposed over the active device region 112, and defining at least one semiconductor device. The polysilicon layer may also include a junction termination portion 120, disposed over the junction termination region 122, where the junction termination portion 120 of the polysilicon layer 108 defines a ring structure, as further shown in FIG. 2 and FIG. 5, discussed further below. More particularly, the ring structure may include a plurality of polysilicon rings, arranged in concentric fashion, around the active device portion 110.

As further shown in FIG. 1, the junction termination region 122 of the semiconductor substrate 102 is arranged as a ring termination region that includes a series of ring structures, arranged as a plurality of well structures, arranged in concentric rings within the semiconductor substrate. As discussed below, these well structures 104, which structures are arranged as concentric rings in the junction termination region 122, may be referred to herein as floating termination rings, and are in part defined by the polysilicon rings of the junction termination portion 120 of the polysilicon layer 108. As discussed below, the polysilicon rings are patterned by a poly-level mask, and themselves may act as a mask, shown in plan view in FIG. 2. Together these well structures 104 in the junction termination region 122 define a floating ring termination for the power semiconductor device 100.

The power semiconductor device 100 further includes an insulator layer 114, extending over portions of the polysilicon layer 108, as well as a metal layer 123, and passivation layer 124. As noted, the power semiconductor device 100 may be incorporated in MOSFET or IGBT in accordance with different embodiments.

Figures 1A, 1B:
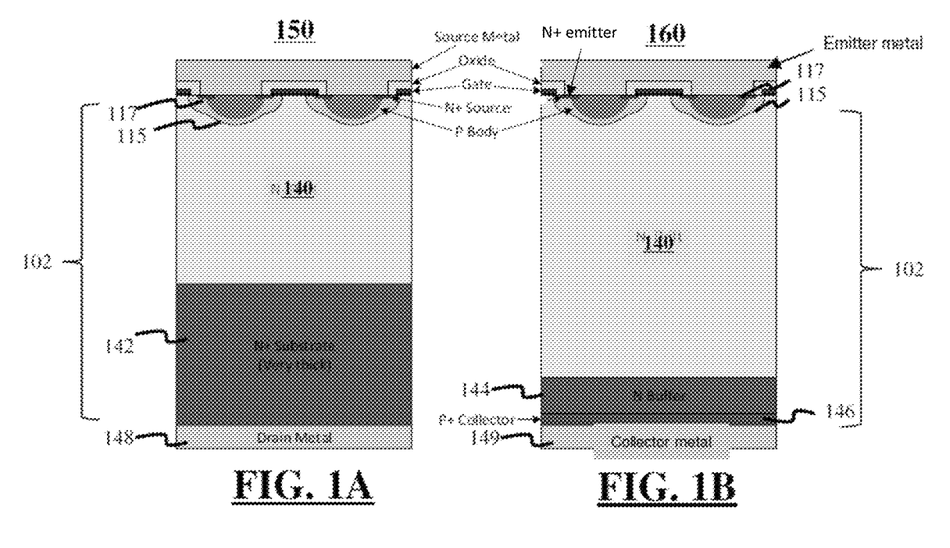
FIG. 1A shows a variant of the power semiconductor device of FIG. 1.
FIG. 1B shows another variant of the power semiconductor device of FIG. 1.

FIG. 1A and FIG. 1B present more details of a MOSFET 150 and IGBT 160 embodiment, respectively. As illustrated, a source region (for MOSFET 150) or emitter region (for IGBT 150) (both regions being N+) is formed in the body region 115 (P region), while the substrate 102 may include multiple layers, including a drift region 140 (N−), as well as N+ substrate region 142 (MOSFET), or N buffer layer 144 and P+ collector 146 (IGBT), not to mention backside metal layer 148 (drain metal), or backside metal layer 149 (collector metal).

FIG. 3A-3K shows various operations involved in fabricating a power semiconductor device, in accordance with embodiments of the present disclosure. At FIG. 3A, the semiconductor substrate 102 is provided, a thin oxide 103 is grown on the semiconductor substrate, and an implantation is performed to implant dopant, such as a relatively lower concentration of N dopant (N− implant), such as phosphorous. According to embodiments of the disclosure, the operations in FIG. 3A may be performed according to known approaches for forming power semiconductors.

Figure 2:
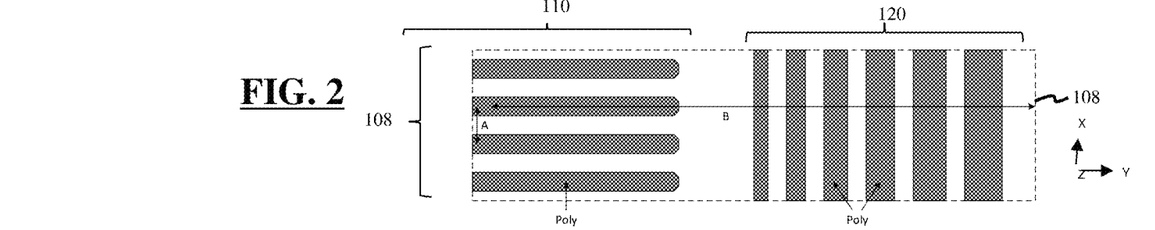
FIG. 2 shows a top plan view of a polysilicon pattern in a polysilicon layer according to embodiments of the disclosure.
Figure 3A:
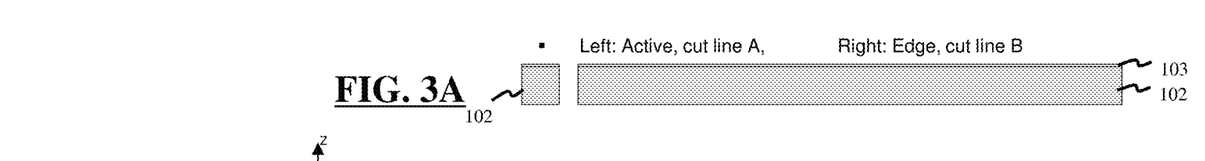
Figure 3B:
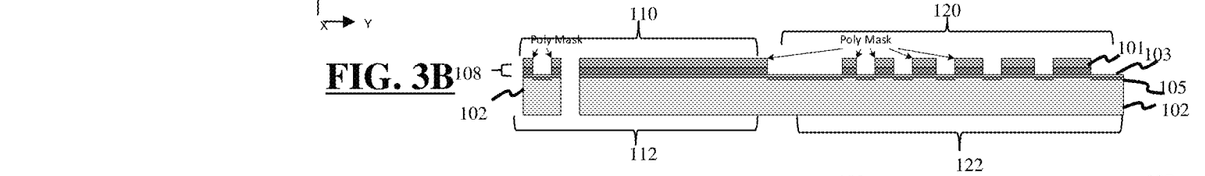

Turning to FIG. 3B, there is shown a subsequent instance after further operations are performed. At this stage, the polysilicon layer 108 has been deposited, a poly-level mask 101, has been deposited, and the poly-level mask 101 has been used to etch portions of the polysilicon layer 108, to form the pattern as shown in FIG. 2. After the patterning of the polysilicon layer 108, the underlying substrate, semiconductor substrate 102, is exposed in portions (notwithstanding the presence of a thin oxide layer). Unlike known processing techniques, where a first mask is used to pattern polysilicon deposited in the active device region and a second mask (ring mask) is used to form patterned ring structures in a ring termination region, in this approach, the polysilicon layer may be deposited over the regions that are to form the active device region 112 and the junction termination region 122, thus facilitating the use of just one mask operation (poly-level mask 101) to pattern the upper surface of the semiconductor substrate 102 for defining implant regions.

An implant operation is then performed, such as implanting a relatively lower concentration of P type dopant (P− implant), such as a boron implantation in the case where the semiconductor substrate is doped with an N− dopant at FIG. 3A. The poly-level mask 101 and patterned polysilicon layer act as an implant mask so the P− dopant is implanted into the semiconductor substrate, just in exposed regions, forming P− regions 105.

As discussed further below, the implant of P− dopant may be used to form well regions that in the semiconductor substrate 102, including in the active device region 112 and in the junction termination region 122.

In the operations of FIGS. 3C to 3K to follow, processing may proceed generally according to known operations for forming an active area of a power semiconductor device, except as otherwise noted.

Figure 3C:
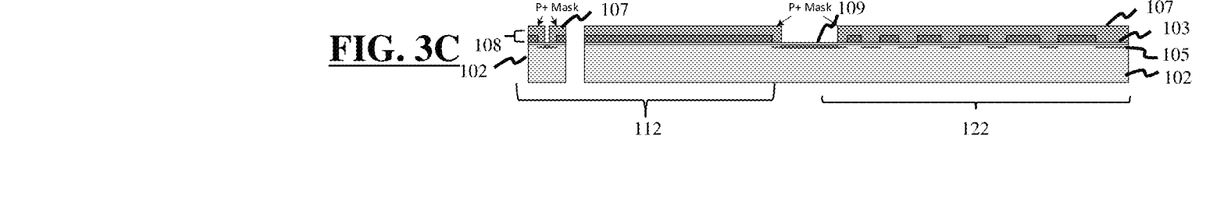

Turning to FIG. 3C, there is shown a subsequent instance after further operations are performed. At this stage, the poly-level mask 101 has been removed, and an implant mask 107 has been formed on the polysilicon layer 108. The implant mask 107 may be used as a mask for relatively higher P-type dopant concentration (P+ mask). The implant is used to form doped regions 109 in the semiconductor substrate 102 where deeper well portions are to be formed.

Figure 3D:
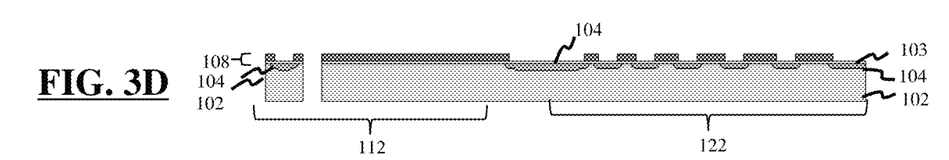

Turning to FIG. 3D, there is shown a subsequent operation after a well drive in operation is performed to form well structures 104, to act as ring termination structures in junction termination region 122 and as active device wells in active device region 112.

Figure 3E:
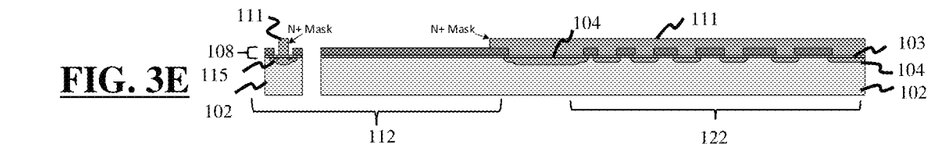

At FIG. 3E an N+ implantation mask 111 has been deposited and patterned, covering the junction termination region 122. The N+ implantation mask 111 has openings in the active device region 112 to facilitate N+ implantation, to form source and body region 115, as shown, using phosphorous or arsenic implantation.

Figure 3F:
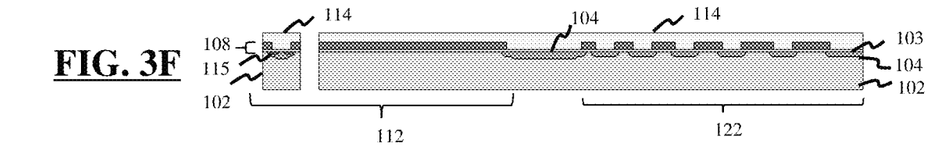

At FIG. 3F, the N+ implantation mask has been removed, and an insulation layer 114 has been deposited over the top surface of the semiconductor substrate 102. The insulation layer 114 may be subjected to a reflow process according to some embodiments.

Figure 3G:
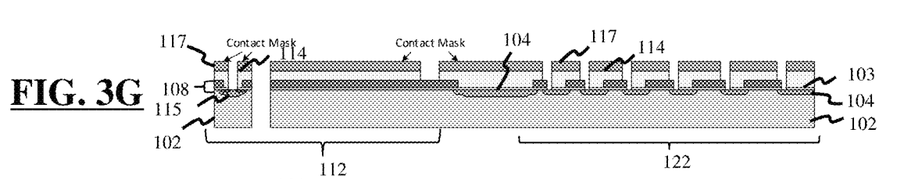

At FIG. 3G, a contact mask 117 has been deposited and patterned over the insulation layer 114, and the insulation layer 114 has been etched using the contact mask 117, to form a series of contact holes or vias, extending through the insulation layer 114, in the junction termination region 122, as well as in the active device region 112.

Figure 3H:
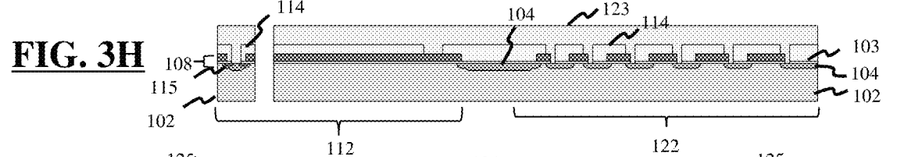
Figure 3I:
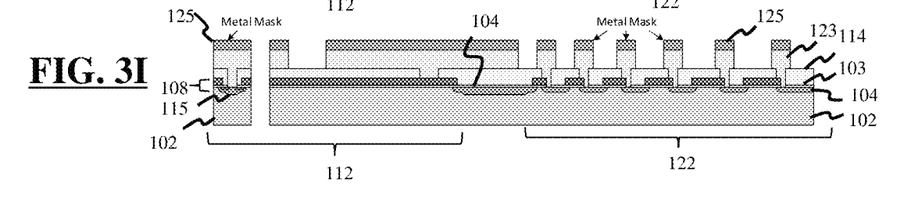
Figure 3J:
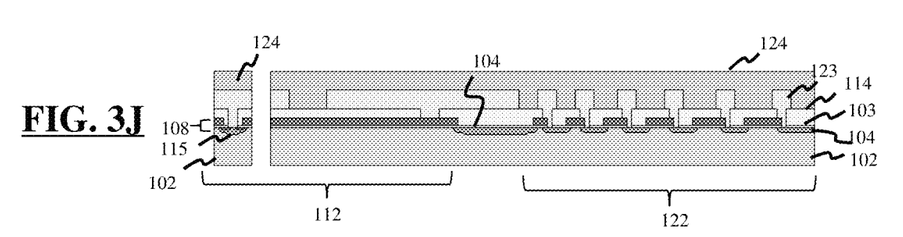
Figure 3K:
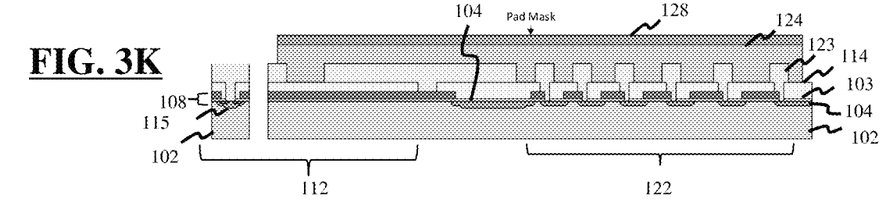

At FIG. 3H, the contact mask 117 has been removed, and a metal layer 123 is deposited over the top of the semiconductor substrate 102 including within vias formed within the insulation layer 114. At FIG. 3I, a metal mask layer 125 has been deposited and patterned, and the metal layer 123 has been patterned by etching the metal layer 123 using the metal layer mask 125. At FIG. 3J, the metal layer mask 125 has been removed, and a passivation layer 124 has been deposited. At FIG. 3K, a pad mask 128 has been deposited, extending over the junction termination region 122, while not extending over the source and body region 115. The passivation layer 124 may then be etched in regions where the pad mask 128 does not cover, as shown. The final device structure may then appear as shown in FIG. 1, after removal of the pad mask 128.

In accordance with the embodiments of FIG. 3A-3K, a total of six masks may be used to synthesize the device structure of power semiconductor device 100. Notably, in known processing approaches a total of seven masks may be used to synthesize a similar device, including a separate poly mask and separate ring mask. The present embodiments thus substantially simplify the process of fabricating a power semiconductor device having a ring termination structure.

Figure 4:
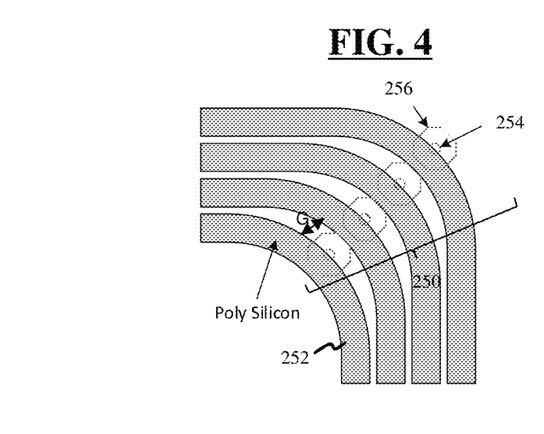
FIG. 4 depicts one configuration of a guard ring structure, according to embodiments of the disclosure.
Figure 5:
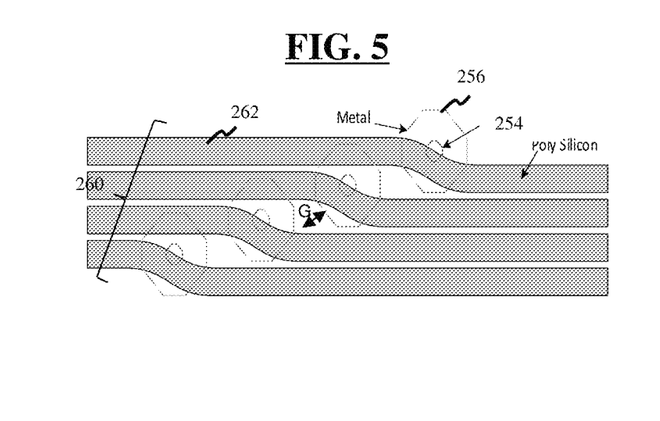
FIG. 5 depicts another configuration of a guard ring structure, according to embodiments of the disclosure.

In various embodiments, the improve the device performance, the lateral spacing (in the X-Y plane) between adjacent termination rings may be reduced as compared to known devices. In order to appropriately contact device structures arranged with termination rings defined by polysilicon rings in accordance with the present embodiments, the spacing between adjacent polysilicon rings may be non-uniformly adjusted. FIG. 4 depicts one configuration of a guard ring structure, according to embodiments of the disclosure, and FIG. 5 depicts another configuration of a guard ring structure, according to embodiments of the disclosure. In FIG. 4, the ring structure 250 includes polysilicon rings 252, arranged concentrically, with just a portion near a corner region shown for simplicity. In this configuration, the gap G between adjacent polysilicon rings is increased in the corner region, as opposed to in the side regions. In FIG. 5, the ring structure 260 includes a plurality of polysilicon rings, shown as polysilicon rings 262, shown in a side region, where the polysilicon rings 262 exhibit a dogleg region to form a gap G of increased size as compared to other regions.

This increase in spacing G allows for metal contact vias 254 to be placed over just one polysilicon ring, while metal 256 is formed above the metal contact vias 254.

Figure 6:
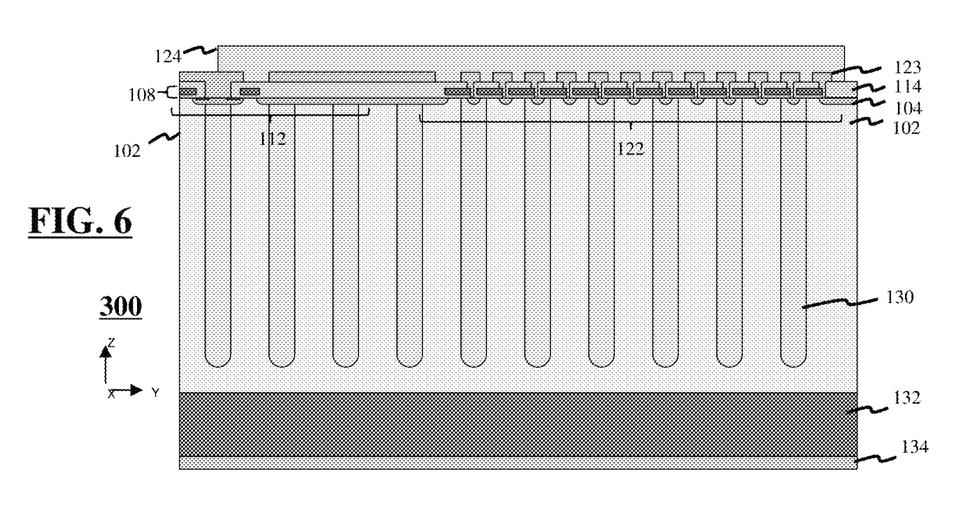
FIG. 6 depicts a side cross-sectional view of another device, according to further embodiments of the disclosure.

Turning to FIG. 6 there is shown another power semiconductor device 300, according to embodiments of the disclosure. The power semiconductor device 300 may include components of the power semiconductor device 100, where like components are labeled the same. Notably, the power semiconductor device 300 is arranged as a so-called superjunction device, including a plurality of semiconductor trenches 130, extending into the semiconductor substrate 102, from the well structures 104. In various embodiments, the power semiconductor device 300 may by an IGBT device or power MOSFET device. For example, the power semiconductor device 300 may include a N+ substrate 132 and backside contact 134.

Figure 7:
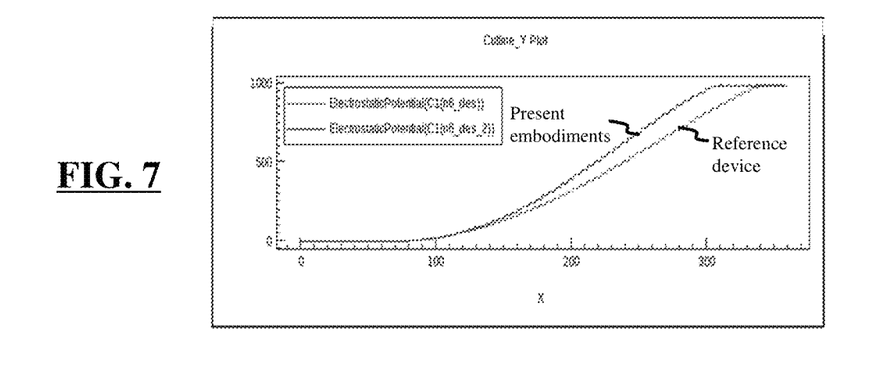
FIG. 7 depicts the results of simulation of potential distributions in a substrate for a power semiconductor device arranged according to the present embodiments, as well as a reference device structure.

While the aforementioned embodiments have shown ring termination regions characterized by just a few polysilicon rings, according to various embodiments, the number of concentric polysilicon rings arranged to form a ring termination region may number in the dozens or hundreds, having a lateral spacing on the order of 5 micrometers. The embodiments are not limited in this context. Various simulation has been performed to compare the electrical performance of devices arranged according to the present embodiments as compared to power semiconductor devices arranged according to known technology. Simulation has shown, for example, less depletion extension in devices according to the present embodiments, while breakdown voltage is nearly the same as in known devices. FIG. 7 presents the results of breakdown voltage as a function of lateral position in a guard ring structure according to the present embodiments and a reference guard ring structure arranged according to known technology, showing similar behavior. FIG. 7 in particular depicts electrostatic potential at the top surface of a silicon substrate (just beneath oxide and metal).

Figure 8:
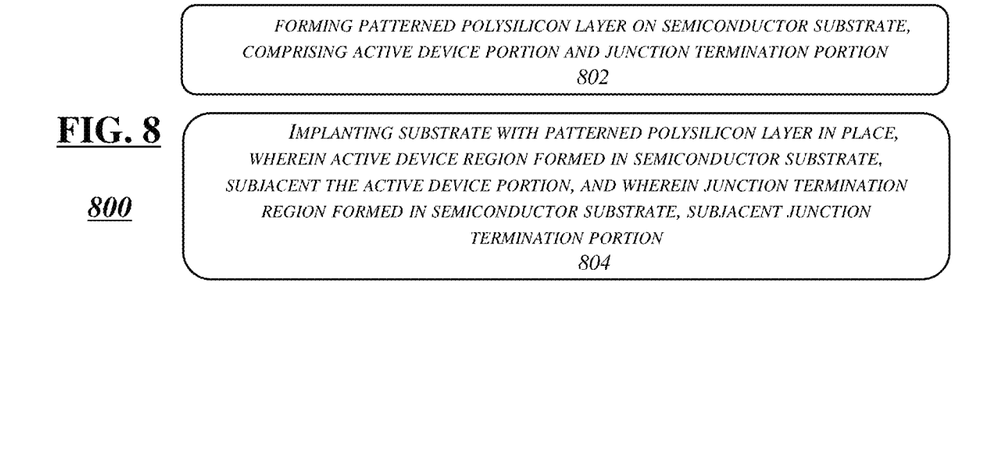
FIG. 8 presents an exemplary process flow, according to embodiments of the disclosure.

FIG. 8 presents an exemplary process flow 800, according to embodiments of the disclosure. At block 802, a patterned polysilicon layer is formed on a semiconductor substrate. The patterned polysilicon layer may be formed to device an active device portion as well as a junction termination portion. The junction termination portion may be arranged in a series of concentric rings in some embodiments. At block 804, the substrate is implanted with the patterned polysilicon layer in place, wherein an active device region is formed in the semiconductor substrate, subjacent to the active device portion of the patterned polysilicon layer. Additionally, a junction termination region is formed in the semiconductor substrate, subjacent the junction termination portion. As such, the junction termination region may be arranged as a series of concentric rings within the semiconductor substrate, such as p-type doped regions.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A power semiconductor device, comprising:
   a semiconductor substrate, wherein the semiconductor substrate comprises an active device region and a junction termination region; and
   a polysilicon layer, disposed over the semiconductor substrate, wherein the polysilicon layer comprises: an active device portion, disposed over the active device region, and defining at least one semiconductor device; and
   a junction termination portion, disposed over the junction termination region, the junction termination portion defining a polysilicon ring structure, wherein the junction termination region comprises a plurality of well structures, wherein at least one well structure of the plurality of well structures comprises:
a first doped region, having a relatively higher dopant concentration of a dopant of a first type, and extending into the semiconductor substrate to a relatively greater depth; and a second doped region, having a relatively lower dopant concentration of the dopant of the first type, and extending into the semiconductor substrate to a relatively lesser depth than the first region.

2. The power semiconductor device of claim 1, the ring structure comprising a plurality of polysilicon rings, arranged in concentric fashion.

3. The power semiconductor device of claim 1, wherein the plurality of well structures are arranged in concentric rings within the semiconductor substrate, the concentric rings being defined by the polysilicon ring structure of the junction termination portion.

4. The power semiconductor device of claim 1, comprising at least one insulated gate bipolar transistor (IGBT) device.

5. The power semiconductor device of claim 1, comprising at least one metal oxide semiconductor field effect transistor (MOSFET) device.

6. The power semiconductor device of claim 1, comprising a superjunction device, wherein a plurality of semiconductor trenches is disposed within the semiconductor substrate, wherein the semiconductor substrate comprises a first dopant type and the plurality of semiconductor trenches comprise a second dopant type.

7. The power semiconductor device of claim 2, wherein the polysilicon ring structure defines a first gap, between adjacent polysilicon rings of the plurality of polysilicon rings in a first region that lies over a first portion of the junction termination region, and wherein the polysilicon ring structure defines a second gap, in a second region that lies over a second portion of the of the junction termination region, the second gap being larger than the first gap.

8. The power semiconductor device of claim 7, wherein the second region is disposed in a corner area of the polysilicon ring structure.

9. The power semiconductor device of claim 7, wherein the plurality of polysilicon rings define a dogleg structure in the second region.

* * * * *